(12) United States Patent
Hasegawa et al.

(10) Patent No.: US 10,305,411 B2
(45) Date of Patent: May 28, 2019

(54) SEMICONDUCTOR MODULE

(71) Applicant: Mitsubishi Electric Corporation, Tokyo (JP)

(72) Inventors: Maki Hasegawa, Tokyo (JP); Takuya Shiraishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 45 days.

(21) Appl. No.: 15/492,073

(22) Filed: Apr. 20, 2017

(65) Prior Publication Data
US 2018/0019695 A1 Jan. 18, 2018

(30) Foreign Application Priority Data

Jul. 14, 2016 (JP) .................. 2016-139405

(51) Int. Cl.
| | |
|---|---|
| *H02P 27/00* | (2006.01) |
| *H02P 27/06* | (2006.01) |
| *H01L 23/538* | (2006.01) |
| *H01L 25/07* | (2006.01) |
| *H01L 25/16* | (2006.01) |
| *H02M 7/5387* | (2007.01) |
| *H02P 3/24* | (2006.01) |
| *H02M 7/00* | (2006.01) |
| *H01L 23/00* | (2006.01) |
| *H02M 1/32* | (2007.01) |
| *H02M 1/42* | (2007.01) |
| *H02P 3/22* | (2006.01) |

(52) U.S. Cl.
CPC .......... *H02P 27/06* (2013.01); *H01L 23/5386* (2013.01); *H01L 25/072* (2013.01); *H01L 25/16* (2013.01); *H02M 7/003* (2013.01); *H02M 7/5387* (2013.01); *H02P 3/24* (2013.01); *H01L 24/48* (2013.01); *H01L 2224/0603* (2013.01); *H01L 2224/48137* (2013.01); *H01L 2224/48227* (2013.01); *H01L 2924/00014* (2013.01); *H01L 2924/13055* (2013.01); *H01L 2924/1425* (2013.01); *H01L 2924/1426* (2013.01); *H02M 1/32* (2013.01); *H02M 2001/4291* (2013.01); *H02P 3/22* (2013.01); *Y02B 70/126* (2013.01)

(58) Field of Classification Search
CPC .... H02P 27/06; H01L 323/5386; H01L 24/48;
H01L 25/072; H01L 25/16
USPC ........................................................ 318/759
See application file for complete search history.

(56) References Cited

U.S. PATENT DOCUMENTS

| | | | | |
|---|---|---|---|---|
| 2013/0241043 | A1* | 9/2013 | Kato | .................. H01L 23/373 257/690 |
| 2014/0184303 | A1* | 7/2014 | Hasegawa | .............. H03K 17/12 327/377 |
| 2015/0069463 | A1* | 3/2015 | Hartmann | ............... H01L 24/49 257/139 |

(Continued)

FOREIGN PATENT DOCUMENTS

JP 2015-135907 A 7/2015

Primary Examiner — Eduardo Colon Santana
Assistant Examiner — Gabriel Agared
(74) Attorney, Agent, or Firm — Studebaker & Brackett PC

(57) ABSTRACT

A semiconductor module includes a die pad area between positions where a plurality of power terminals are arranged and positions where an HVIC and an LVIC are arranged. A plurality of RC-IGBTs are arranged in the die pad area at positions closer to the plurality of power terminals than to the HVIC and the LVIC.

12 Claims, 9 Drawing Sheets

(56) References Cited

U.S. PATENT DOCUMENTS

2015/0155228 A1* 6/2015 Ikeda ................ H01L 23/49575
257/140

* cited by examiner

SEMICONDUCTOR MODULE

BACKGROUND OF THE INVENTION

Field of the Invention

The present invention relates to a semiconductor module.

Description of the Background Art

Conventionally, there has been known a transfer mold-type intelligent power module (IPM) including a reverse conducting insulated gate bipolar transistor (RC-IGBT) and a control IC, the RC-IGBT containing a free wheel diode (hereinafter referred to as FWD) as a power semiconductor element in a chip (see, for example, Japanese Patent Laying-Open No. 2015-135907).

The use of the RC-IGBT eliminates the need for additionally mounting a free wheel diode, which has been necessary when using an ordinary IGBT for an inverter.

SUMMARY OF THE INVENTION

However, since it is necessary to unify the outer shape of transfer mold-type IPMs, the transfer mold-type IPM including an RC-IGBT mounted therein should have a pad size equal to that of a transfer mold-type IPM adopting ordinary IGBT and FWD which are not integrated in one chip, in a plan view.

In addition, in the transfer mold-type IPM including an RC-IGBT mounted therein, the position for mounting the RC-IGBT is not considered, and the RC-IGBT is mounted at a position equal to the position for mounting the IGBT in the transfer mold-type IPM adopting the ordinary IGBT and FWD described above, in a plan view.

Thus, an emitter wire from the RC-IGBT to an output terminal is drawn with a relatively long loop length, and thereby wiring inductance inside a package may be increased, and a surge voltage generated across a power chip may be excessively generated.

The present invention has been made to solve the aforementioned problem, and an object of the present invention is to provide a semiconductor module which can prevent excessive generation of a surge voltage generated across a power chip.

In order to solve the aforementioned problem, a semiconductor module of the present invention includes at least one RC-IGBT, at least one control IC, a power terminal, a gate wire which connects a gate of an IGBT in the RC-IGBT and the control IC, and an emitter wire which connects an emitter of the IGBT in the RC-IGBT and the power terminal. The semiconductor module includes a die pad area between a position where the power terminal is arranged and a position where the control IC is arranged. The RC-IGBT is arranged in the die pad area at a position closer to the power terminal than to the control IC.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
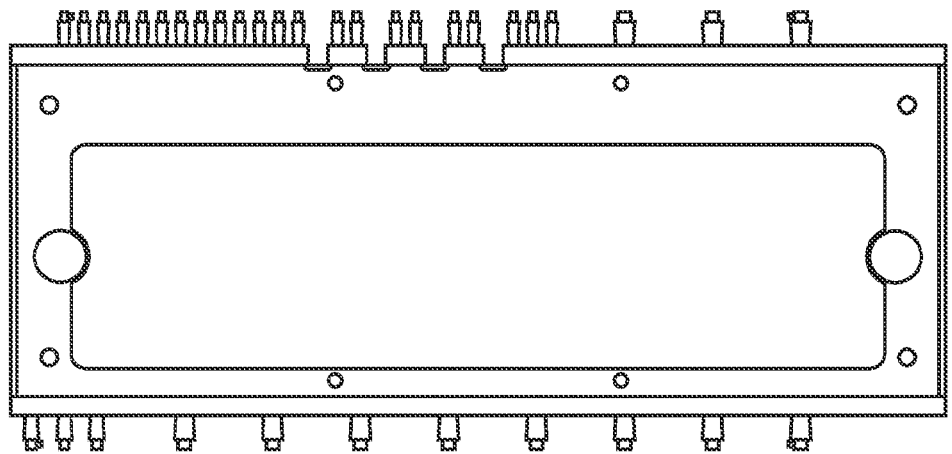
FIG. 1 is a view showing an outer shape of a transfer mold-type IPM of a first embodiment.

FIG. 1 is a view showing an outer shape of a transfer mold-type IPM of a first embodiment.

The transfer mold-type IPM at least includes a control IC and a plurality of power chips. Semiconductor elements in the transfer mold-type IPM are sealed with a mold resin by a transfer mold method.

Figure 2:
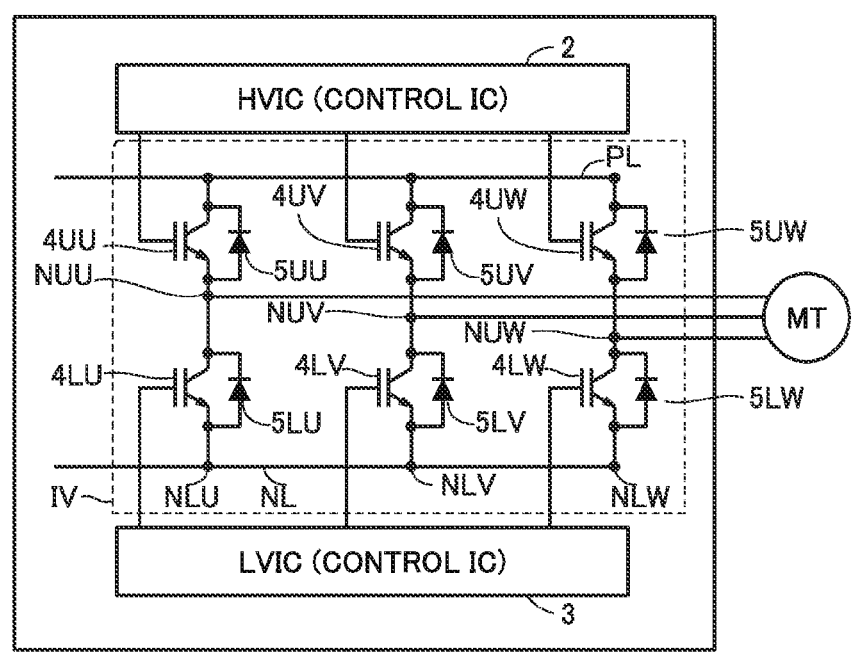
FIG. 2 is a view showing components included in the transfer mold-type IPM in the first embodiment.

FIG. 2 is a view showing components included in the transfer mold-type IPM in the first embodiment.

The transfer mold-type IPM includes a three-phase inverter IV, a high voltage integrated circuit (HVIC) (control IC) 2, and a low voltage integrated circuit (LVIC) (Control IC) 3.

The transfer mold-type IPM is connected with a three-phase induction motor MT.

Three-phase induction motor MT is configured to be driven by a three-phase voltage having different phases. Specifically, in three-phase induction motor MT, a rotating magnetic field is generated around a rotor, which is a conductor, using a three-phase alternating current (AC) having three phases called a U phase, a V phase, and a W phase having a phase shift of 120 degrees.

Three-phase inverter IV converts input direct current (DC) power into AC power.

In three-phase inverter IV, IGBTs 4UU, 4UV, 4UW are connected in anti-parallel with FWDs 5UU, 5UV, 5UW, respectively, between a positive voltage line PL and terminals of the respective phases (U phase, V phase, W phase) of three-phase induction motor MT, and IGBTs 4LU, 4LV, 4LW are connected in anti-parallel with FWDs 5LU, 5LV, 5LW, respectively, between the terminals of the respective phases of three-phase induction motor MT and a negative voltage line NL.

Emitters of IGBTs 4UU, 4UV, 4UW and anodes of FWDs 5UU, 5UV, 5UW are connected to power terminals NUU, NUV, NUW, respectively. Power terminals NUU, NUV, NUW are output terminals of the U phase, the V phase, and the W phase of three-phase inverter IV.

Emitters of IGBTs 4LU, 4LV, 4LW and anodes of FWDs 5LU, 5LV, 5LW are connected to power terminals NLU, NLV, NLW, respectively. Power terminals NLU, NLV. NLW are voltage-input terminals connected to negative voltage line NL.

Gates of IGBTs 4UU, 4UV, 4UW are connected with HVIC 2. HVIC 2 is a high-side control circuit. HVIC 2 generates a drive signal for driving IGBTs 4UU, 4UV, 4UW based on a drive control signal input from the outside of the transfer mold-type IPM, and applies the drive signal to the gates of IGBTs 4UU, 4UV, 4UW. HVIC 2 is a high-voltage IC capable of handling a voltage of more than or equal to 1000 (V), for example.

Gates of IGBTs 4LU, 4LV, 4LW are connected with LVIC 3. LVIC 3 is a low-side control circuit. LVIC 3 generates a drive signal for driving IGBTs 4LU, 4LV, 4LW based on a drive control signal input from the outside of the transfer mold-type IPM, and applies the drive signal to the gates of IGBTs 4LU, 4LV, 4LW. LVIC 3 handles a voltage lower than the voltage handled by HVIC 2.

Figure 3:
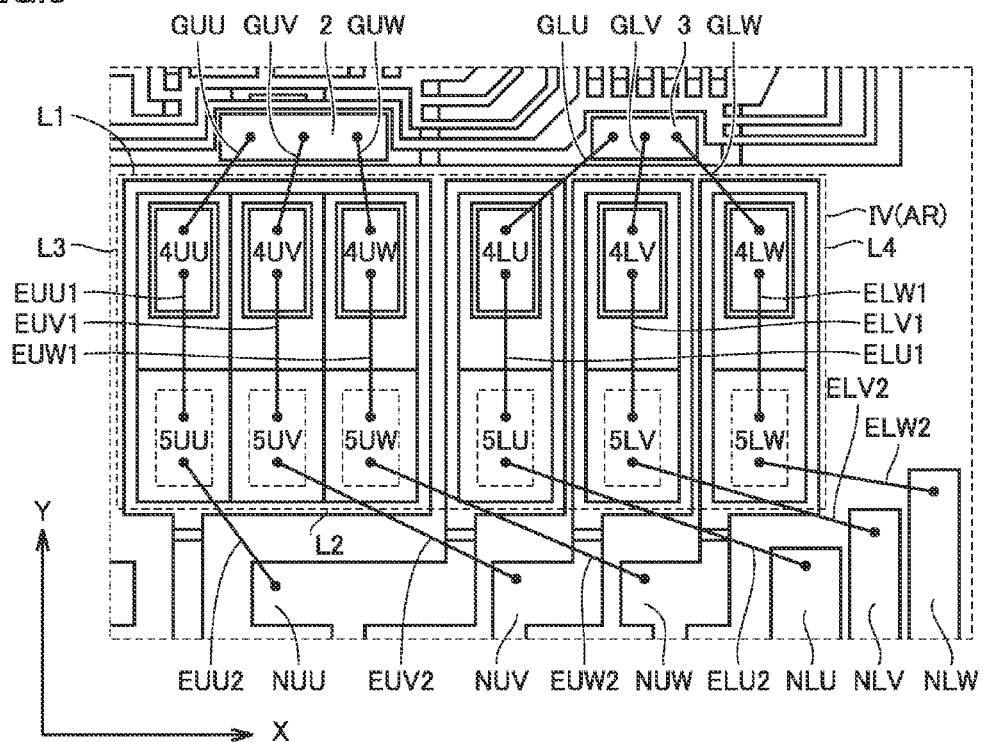
FIG. 3 is a view showing a portion of a layout of a conventional transfer mold-type IPM.

FIG. 3 is a view showing a portion of a layout of a conventional transfer mold-type IPM.

As shown in FIG. 3, a rectangular die pad area AR is present between positions of power terminals NUU, NUV, NUW, NLU, NLV, NLW and positions of HVIC 2 and LVIC 3 on a substrate.

A side of die pad area AR closest to HVIC 2 and LVIC 3 is defined as a first side L1, a side opposite to the first side is defined as a second side L2, and sides perpendicular to the first side and the second side are defined as a third side L3 and a fourth side L4. A direction in which first side L1 and second side L2 extend is defined as an X direction, and a direction in which third side L3 and fourth side L4 extend is defined as a Y direction.

IGBTs 4UU, 4UV, 4UW, 4LU, 4LV, 4LW are arranged at positions close to first side L1 of die pad area AR. FWDs 5UU, 5UV, 5UW, 5LU, 5LV, 5LW are arranged at positions close to second side L2 of die pad area AR.

The gate of IGBT 4UU and HVIC 2 are connected by a gate wire GUU. The gate of IGBT 4UV and HVIC 2 are connected by a gate wire GUV. The gate of IGBT 4UW and HVIC 2 are connected by a gate wire GUW. The gate of IGBT 4LU and LVIC 3 are connected by a gate wire GLU. The gate of IGBT 4LV and LVIC 3 are connected by a gate wire GLV. The gate of IGBT 4LW and LVIC 3 are connected by a gate wire GLW.

The emitter of IGBT 4UU and the anode of FWD 5UU are connected by an emitter wire EUU1. The anode of FWD 5UU and power terminal NUU are connected by an emitter wire EUU2. The emitter of IGBT 4UV and the anode of FWD 5UV are connected by an emitter wire EUV1. The anode of FWD 5UV and power terminal NUV are connected by an emitter wire EUV2. The emitter of IGBT 4UW and the anode of FWD 5UW are connected by an emitter wire EUW1. The anode of FWD 5UW and power terminal NUW are connected by an emitter wire EUW2. The emitter of IGBT 4LU and the anode of FWD 5LU are connected by an emitter wire ELU1. The anode of FWD 5LU and power terminal NLU are connected by an emitter wire ELU2. The emitter of IGBT 4LV and the anode of FWD 5LV are connected by an emitter wire ELV1. The anode of FWD 5LV and power terminal NLV are connected by an emitter wire ELV2. The emitter of IGBT 4LW and the anode of FWD 5LW are connected by an emitter wire ELW1. The anode of FWD 5LW and power terminal NLW are connected by an emitter wire ELW2.

Figure 4:
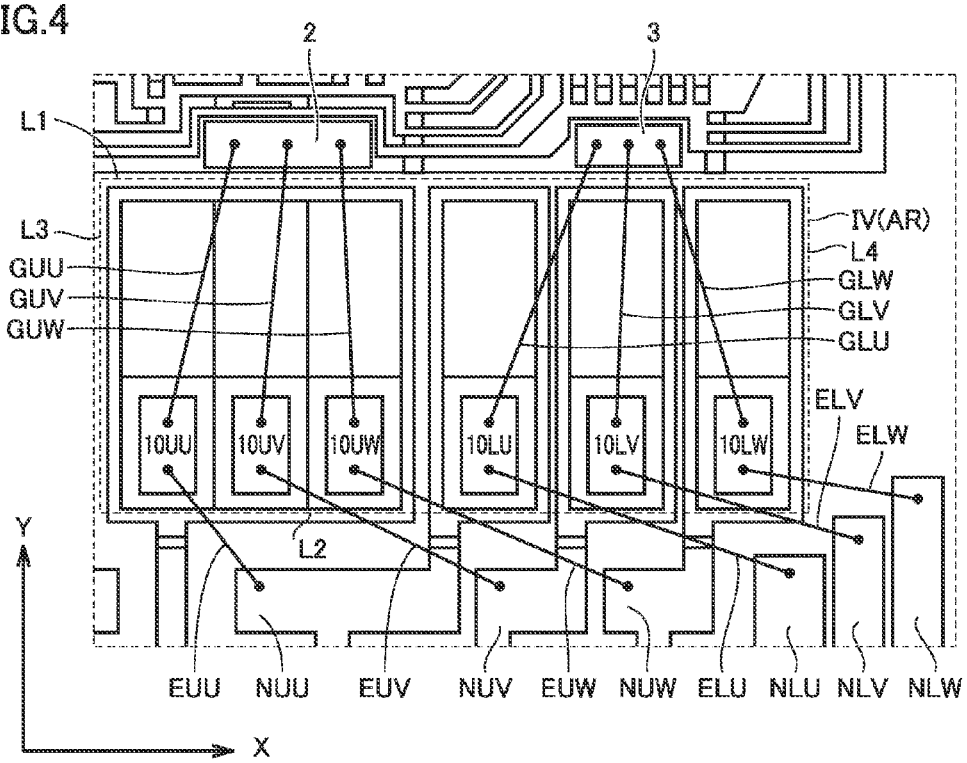
FIG. 4 is a view showing a portion of a layout of the transfer mold-type IPM of the first embodiment.

FIG. 4 is a view showing a portion of a layout of the transfer mold-type IPM of the first embodiment.

An RC-IGBT 10UU is a chip containing IGBT 4UU and FWD 5UU integrated therein (integrated in one chip). An RC-IGBT 10UV is a chip containing IGBT 4UV and FWD 5UV integrated therein (integrated in one chip). An RC-IGBT 10UW is a chip containing IGBT 4UW and FWD 5UW integrated therein (integrated in one chip). An RC-IGBT 10LU is a chip containing IGBT 4LU and FWD 5LU integrated therein (integrated in one chip). An RC-IGBT 10LV is a chip containing IGBT 4LV and FWD 5LV integrated therein (integrated in one chip). An RC-IGBT 10LW is a chip containing IGBT 4LW and FWD 5LW integrated therein (integrated in one chip).

As with the conventional layout, RC-IGBTs 10UU, 10UV, 10UW, 10LU, 10LV, 10LW are arranged in die pad area AR on a substrate.

In the first embodiment, RC-IGBTs 10UU, 10 UV, 10UW, 10LU, 10LV, 10LW are arranged at positions closer to power terminals NUU, NUV, NUW, NLU, NLV, NLW than to HVIC 2, LVIC 3, specifically, at positions closer to second side L2 than to first side L1 in the Y direction.

Preferably, RC-IGBTs 10UU, 10UV, 10UW, 10LU, 10LV, 10LW are arranged at the positions closer to second side L2 than to first side L1 in the Y direction. More preferably, RC-IGBTs 10UU, 10UV, 10UW, 10LU, 10LV, 10LW are arranged in one line along second side L2, as shown in FIG. 4.

HVIC 2 is connected with the gate of the IGBT in RC-IGBT 10UU by gate wire GUU. HVIC 2 is connected with the gate of the IGBT in RC-IGBT 10UV by gate wire GUV. HVIC 2 is connected with the gate of the IGBT in RC-IGBT 10UW by gate wire GUW. LVIC 3 is connected with the gate of the IGBT in RC-IGBT 10LU by gate wire GLU. LVIC 3 is connected with the gate of the IGBT in RC-IGBT 10LV by gate wire GLV. LVIC 3 is connected with the gate of the IGBT in RC-IGBT 10LW by gate wire GLW.

The emitter of the IGBT in RC-IGBT 10UU is connected with power terminal NUU by an emitter wire EUU. The emitter of the IGBT in RC-IGBT 10UV is connected with power terminal NUV by an emitter wire EUV. The emitter of the IGBT in RC-IGBT 10UW is connected with power terminal NUW by an emitter wire EUW. The emitter of the IGBT in RC-IGBT 10LU is connected with power terminal NLU by an emitter wire ELU. The emitter of the IGBT in RC-IGBT 10LV is connected with power terminal NLV by an emitter wire ELV. The emitter of the IGBT in RC-IGBT 10LW is connected with power terminal NLW by an emitter wire ELW.

With such a configuration as described above, in the first embodiment, wiring of the emitter wires can be shortened when compared with conventional wiring. By shortening wiring of the emitter wires, internal inductance can be reduced, and a surge voltage generated across a power chip (between a collector terminal and an emitter terminal of an IGBT) can be suppressed.

It should be noted that, in the first embodiment, when compared with conventional wiring, wiring of the emitter wires is shortened, whereas wiring of the gate wires becomes longer. Although this leads to an increased inductance of the gate wires, the increased inductance has no effect because the gate wires are not main current paths.

It should be noted that, in the conventional transfer mold-type IPM in which an IGBT and a FWD are not integrated in one chip, wiring of the emitter wires can be shortened when the positions of the IGBT and the FWD are reversed. However, there occurs a problem that the gate wires which connect the gates of the IGBTs with the LVIC and the HVIC tend to interfere with the emitter wires. In contrast, such a problem does not occur in the layout of the transfer mold-type IPM of the present embodiment shown in FIG. 4.

It should be noted that, in the present embodiment, the control IC is divided into two ICs, i.e., the HVIC and the LVIC, in order to facilitate layout design and wiring design. However, the control IC is not limited thereto. One control IC may have the function of the HVIC and the function of the LVIC. Adopting one control IC can eliminate means for notifying from one IC to the other IC in a case where a malfunction occurs in an upper arm or a lower arm. The same applies to second to fifth embodiments described below.

Second Embodiment

Figure 5:
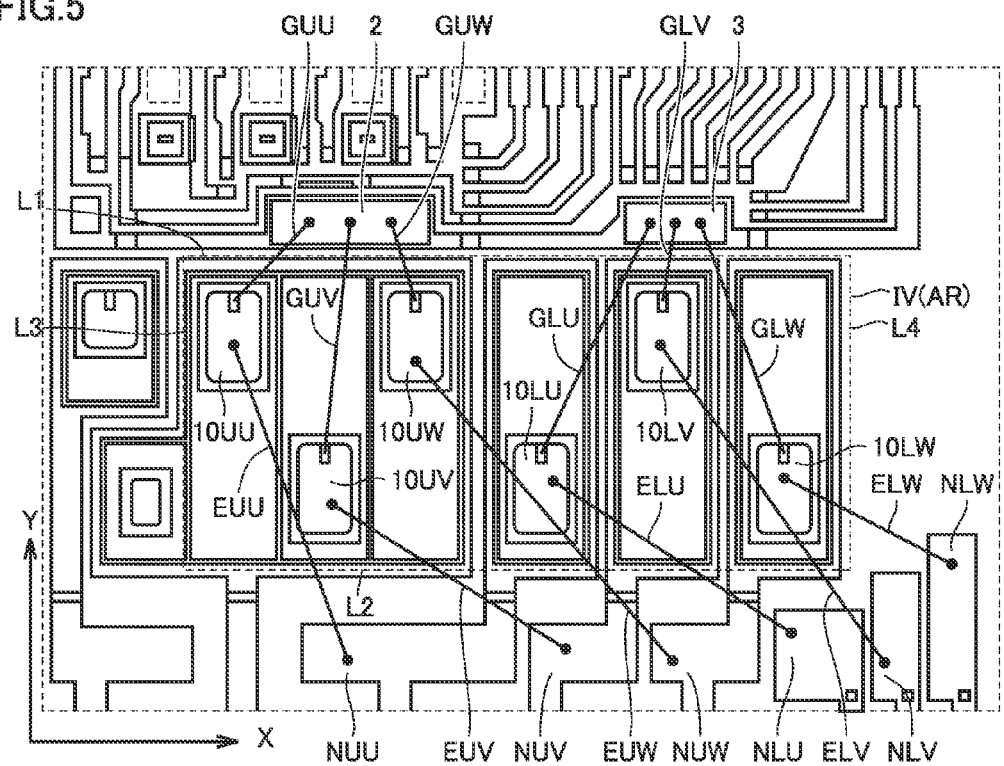
FIG. 5 is a view showing a layout of a transfer mold-type IPM of a second embodiment.

FIG. 5 is a view showing a layout of a transfer mold-type IPM of a second embodiment.

Also in the second embodiment. RC-IGBTs 10UU, 10UV, 10UW, 10LU, 10LV, 10LW are arranged in die pad area AR, as in the first embodiment.

The connection relation between RC-IGBTs 10UU, 10UV, 10UW, 10LU, 10LV, 10LW and HVIC 2, LVIC 3, power terminals NUU, NUV, NUW, NLU, NLV, NLW in the second embodiment is the same as that in the first embodiment.

In the second embodiment, of two RC-IGBTs for an upper arm and a lower arm of each phase, one is arranged at a position closer to second side L2 than to first side L1 in the Y direction, and the other is arranged at a position closer to first side L1 than to second side L2 in the Y direction.

Further, six RC-IGBTs are arranged in a staggered pattern along the X direction. That is, of two RC-IGBTs adjacent in the X direction, one is arranged at a position closer to second side L2 than to first side L1 in the Y direction, and the other is arranged at a position closer to first side L1 than to second side L2 in the Y direction.

The example of FIG. 5 will be specifically described.

The six RC-IGBTs are arranged in the X direction in order of RC-IGBTs 10UU, 10UV, 10UW, 10LU, 10LV, 10LW from the left side. These six RC-IGBTs are arranged in a staggered pattern in the X direction. The six RC-IGBTs are arranged in the Y direction in the following manner. RC-IGBT 10UU at the left end is arranged at a position close to first side L1 RC-IGBT 10UV adjacent to RC-IGBT 10UU is arranged at a position close to second side L2. RC-IGBT 10UW adjacent to RC-IGBT 10UV is arranged at a position close to first side L1. RC-IGBT 10LU adjacent to RC-IGBT 10UW is arranged at a position close to second side L2. RC-IGBT 10LV adjacent to RC-IGBT 10LU is arranged at a position close to first side L1. RC-IGBT 10LW adjacent to RC-IGBT 10LV is arranged at a position close to second side L2.

Further, RC-IGBT 10UU for the upper arm of the U phase is arranged at the position close to first side L1, and RC-IGBT 10LU for the lower arm of the U phase is arranged at the position close to second side L2. RC-IGBT 10UV for the upper arm of the V phase is arranged at the position close to second side L2, and RC-IGBT 10LV for the lower arm of the V phase is arranged at the position close to first side L1. RC-IGBT 10UW for the upper arm of the W phase is arranged at the position close to first side L1, and RC-IGBT 10LW for the lower arm of the W phase is arranged at the position close to second side L2.

With such a configuration as described above, in the second embodiment, when a phase has a long wiring of the emitter wire for one of the elements for the upper arm and the lower arm, the phase has a short wiring of the emitter wire for the other of the elements for the upper arm and the lower arm. Accordingly, as entire three-phase inverter IV, internal inductance can be reduced, and a surge voltage generated across a power chip can be suppressed, when compared with the conventional transfer mold-type IPM.

Further, the respective phases can have the same sum of the length of the emitter wire for the upper arm and the length of the emitter wire for the lower arm, which can prevent deterioration in the performance of the three-phase inverter due to a difference in the inductances of the respective phases.

Third Embodiment

Figure 6:
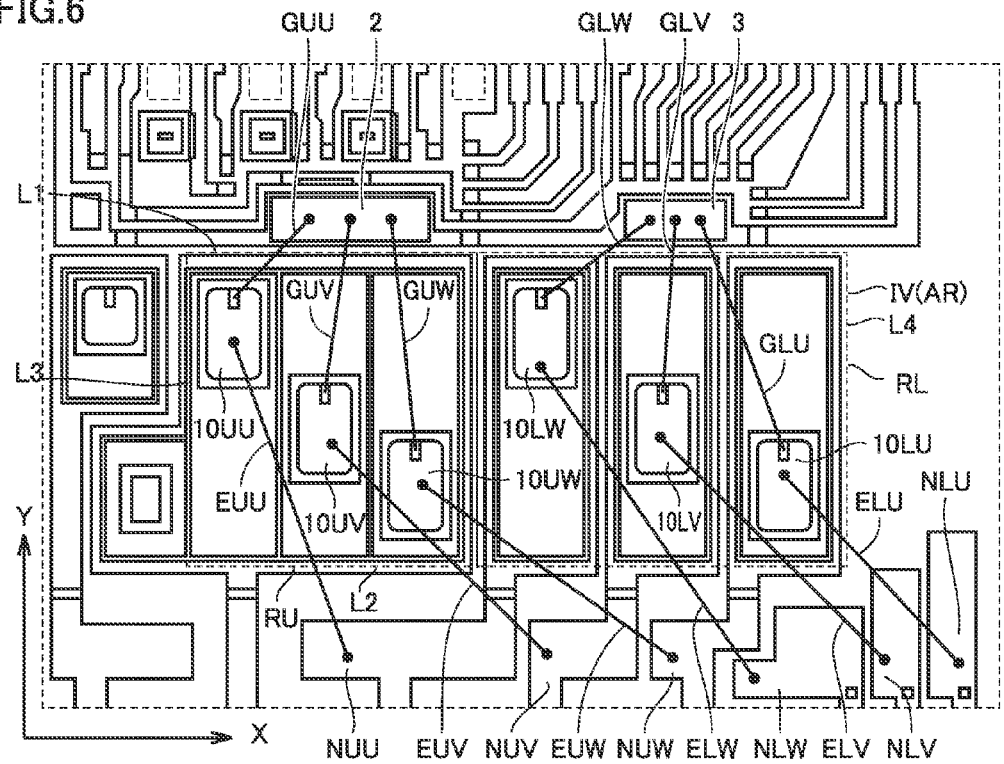
FIG. 6 is a view showing a layout of a transfer mold-type IPM of a third embodiment.

FIG. 6 is a view showing a layout of a transfer mold-type IPM of a third embodiment.

Also in the third embodiment, RC-IGBTs 10UU, 10UV, 10UW, 10LU, 10LV, 10LW are arranged in die pad area AR, as in the first embodiment.

The connection relation between RC-IGBTs 10UU, 10UV, 10UW, 10LU, 10LV, 10LW and HVIC 2, LVIC 3, power terminals NUU, NUV, NUW, NLU, NLV, NLW in the third embodiment is the same as that in the first embodiment.

In the third embodiment, for each of two of the three phases, of two RC-IGBTs for an upper arm and a lower arm, one is arranged at a position closer to second side L2 than to first side L1 in the Y direction, and the other is arranged at a position closer to first side L1 than to second side L2 in the Y direction. For one of the three phases, both of two RC-IGBTs for an upper arm and a lower arm are each arranged at a substantially central position between first side L1 and second side L2 in the Y direction.

Die pad area AR is divided into two regions RU and RL in the X direction. Three RC-IGBTs are arranged in each of regions RU and RL.

In region RU, the three RC-IGBTs are arranged in a step-like pattern. That is, of the three RC-IGBTs arranged in region RU, an RC-IGBT at a position close to one end of region RU in the X direction (referred to as R(1)) is arranged at a position closer to first side L1 than to second side L2 in the Y direction. An RC-IGBT at a position close to the other end of region RU in the X direction (referred to as R(2)) is arranged at a position closer to second side L2 than to first side L1 in the Y direction. An RC-IGBT located between the position of R(1) and the position of R(2) in the X direction (referred to as R(3)) is arranged at a position between the position of R(1) and the position of R(2) in the Y direction.

Similarly, in region RL, the three RC-IGBTs are arranged in a step-like pattern. That is, of the three RC-IGBTs arranged in region RL, an RC-IGBT at a position close to one end of region RL in the X direction (referred to as R(4)) is arranged at a position closer to first side L1 than to second side L2 in the Y direction. An RC-IGBT at a position close to the other end of region RL in the X direction (referred to as R(5)) is arranged at a position closer to second side L2 than to first side L1 in the Y direction. An RC-IGBT located between the position of R(4) and the position of R(5) in the X direction (referred to as R(6)) is arranged at a position between the position of R(4) and the position of R(5) in the Y direction.

The example of FIG. 6 will be specifically described.

In region RU, the three RC-IGBTs are arranged in a step-like pattern in the X direction in order of RC-IGBTs 10UU, 10UV, 10UW from the left side. That is, of the three RC-IGBTs, RC-IGBT 10UU at a position close to one end of region RU in the X direction is arranged at a position closer to first side L1 than to second side L2 in the Y direction. RC-IGBT 10UW at a position close to the other end of region RU in the X direction is arranged at a position closer to second side L2 than to first side L1 in the Y direction. RC-IGBT 10UV located between the position of RC-IGBT 10UU and the position of RC-IGBT 10UW in the X direction is arranged at a position between the position of RC-IGBT 10UU and the position of RC-IGBT 10UW in the Y direction.

In region RL, the three RC-IGBTs are arranged in a step-like pattern in the X direction in order of RC-IGBTs 10LW, 10LV, 10LU from the left side. That is, of the three RC-IGBTs, RC-IGBT 10LW at a position close to one end of region RL in the X direction is arranged at a position closer to first side L1 than to second side L2 in the Y direction. RC-IGBT 10LU at a position close to the other end of region RL in the X direction is arranged at a position closer to second side L2 than to first side L1 in the Y direction. RC-IGBT 10LV located between the position of RC-IGBT 10LW and the position of RC-IGBT 10LU in the X direction is arranged at a position between the position of RC-IGBT 10LW and the position of RC-IGBT 10LU in the Y direction.

Further, RC-IGBT 10UU for the upper arm of the U phase is arranged at the position close to first side L1, and RC-IGBT 10LU for the lower arm of the U phase is arranged at the position close to second side L2. RC-IGBT 10UV for the upper arm of the V phase is arranged at the substantially central position between first side L1 and second side L2, and RC-IGBT 10LV for the lower arm of the V phase is arranged at the substantially central position between first side L1 and second side L2. RC-IGBT 10UW for the upper arm of the W phase is arranged at the position close to second side L2, and RC-IGBT 10LW for the lower arm of the W phase is arranged at the position close to first side L1.

With such a configuration as described above, in the third embodiment, when a phase has a long wiring of the emitter wire for one of the elements for the upper arm and the lower arm, the phase has a short wiring of the emitter wire for the other of the elements for the upper arm and the lower arm. Alternatively, wiring of the emitter wires for both of the elements for the upper arm and the lower arm is designed not to be long. Accordingly, as entire three-phase inverter IV, internal inductance can be reduced, and a surge voltage generated across a power chip can be suppressed, when compared with the conventional transfer mold-type IPM. Further, as in the second embodiment, the respective phases can have the same sum of the length of the emitter wire for the upper arm and the length of the emitter wire for the lower arm, which can prevent deterioration in the performance of the three-phase inverter due to a difference in the inductances of the respective phases.

Fourth Embodiment

Figure 7:
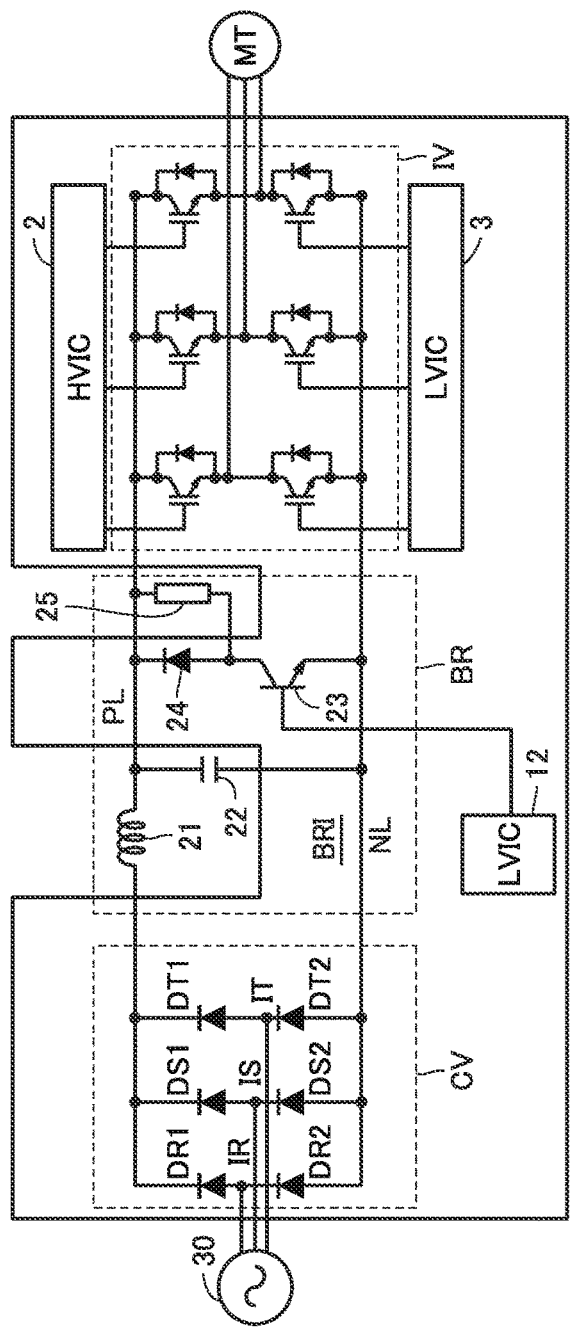
FIG. 7 is a view showing components included in a transfer mold-type IPM in a fourth embodiment.

FIG. 7 is a view showing components included in a transfer mold-type IPM in a fourth embodiment.

In the fourth embodiment, the transfer mold-type IPM includes a converter CV, and some components (referred to as BRI) of a brake circuit BR, in addition to the components of the first embodiment.

Converter CV includes diodes DR1, DR2, DS1, DS2, DT1, DT2.

Cathodes of diodes DR1, DS1. DT1 are connected in common to positive voltage line PL. Anodes of diodes DR1, DS1, DT1 and cathodes of diodes DR2, DS2, DT2 are electrically connected, respectively, and connection points therebetween are connected to input terminals IR, IS, IT, respectively, of an AC power supply 30. AC voltages of an R phase, an S phase, and a T phase are input into input terminals IR, IS, IT, respectively, of AC power supply 30. Anodes of diodes DR2, DS2, DT2 are connected in common to negative voltage line NL.

Brake circuit BR includes an IGBT 23, a diode 24, a resistor 25, a capacitor 22, and a coil 21. Of these, IGBT 23, diode 24, and resistor 25 are components BRI contained in the transfer mold-type IPM.

An emitter of IGBT 23 is connected to negative voltage line NL, and a collector of IGBT 23 is connected with one end of diode 24 and one end of resistor 25. A gate of IGBT 23 receives a drive signal from an LVIC 12.

The other end of diode 24 and the other end of resistor 25 are connected to positive voltage line PL.

Capacitor 22 is arranged between positive voltage line PL and negative voltage line NL.

Coil 21 is arranged on positive voltage line PL. Coil 21 is arranged between an output node of converter CV and a node at which capacitor 22 is connected with positive voltage line PL.

Brake circuit BR is a circuit for applying electric braking when stopping three-phase induction motor MT.

Figure 8:
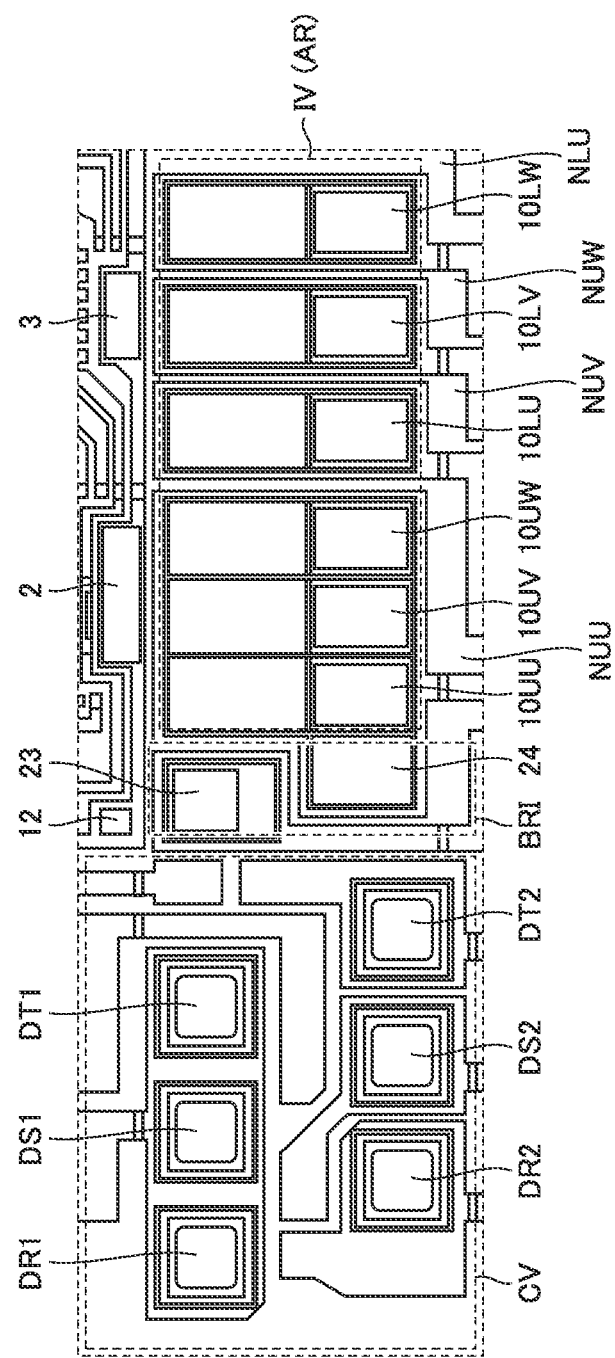
FIG. 8 is a view showing a portion of a layout of the transfer mold-type IPM of the fourth embodiment.

FIG. 8 is a view showing a portion of a layout of the transfer mold-type IPM of the fourth embodiment.

As shown in FIG. 8, three-phase inverter IV, HVIC 2, and LVIC 3 are arranged as in the first embodiment. In the fourth embodiment, converter CV is arranged, and some components (BRI) of brake circuit BR are arranged between converter CV and three-phase inverter IV. Further, LVIC 12 is arranged adjacent to some components (BRI) of brake circuit BR and HVIC 2.

In the present embodiment, since the arrangement of three-phase inverter IV, HVIC 2, LVIC 3, and power terminals NUU, NUV, NUW, NLU, NLV, NLW is the same as that in the first embodiment, the same effect as that in the first embodiment can be obtained.

It should be noted that, although the transfer mold-type IPM of the present embodiment is configured to include converter CV and some components (referred to as BRI) of brake circuit BR in addition to the components of the first embodiment, it is not limited thereto. The transfer mold-type IPM may be configured to include converter CV and some components (referred to as BRI) of brake circuit BR in addition to the components of the second or third embodiment.

Fifth Embodiment

Figure 9:
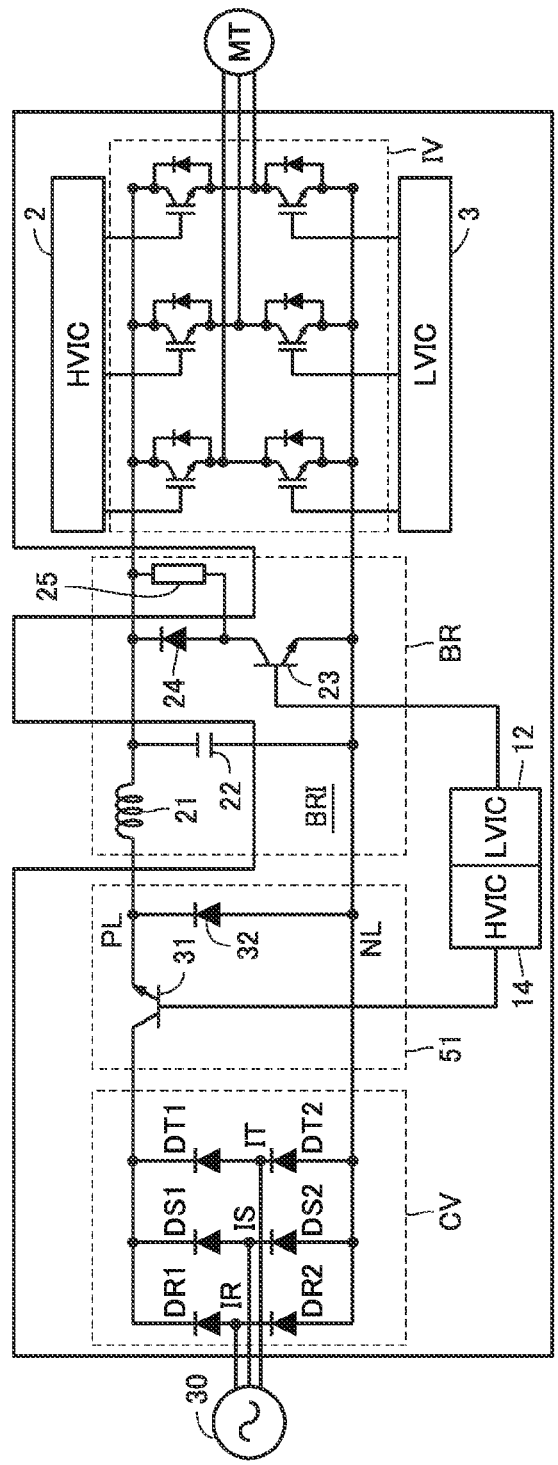
FIG. 9 is a view showing components included in a transfer mold-type IPM in a fifth embodiment.

FIG. 9 is a view showing components included in a transfer mold-type IPM in a fifth embodiment.

In the fifth embodiment, the transfer mold-type IPM includes components of a power factor correction (PFC) circuit 51, in addition to the components of the fourth embodiment.

PFC circuit 51 is arranged between converter CV and brake circuit BR.

PFC circuit 51 includes an IGBT 31 and a diode 32.

Diode 32 is arranged between positive voltage line PL and negative voltage line NL. A node at which diode 32 is connected with positive voltage line PL is connected with one end of coil 21.

IGBT 31 is arranged on positive voltage line PL. A collector of IGBT 31 is connected with the output node of converter CV, and an emitter of IGBT 31 is connected to the node at which diode 32 is connected with positive voltage line PL. A gate of IGBT 31 receives a drive signal from an HVIC 14.

PFC circuit 51 improves a power factor by suppressing a harmonic current generated in converter CV. That is, PFC circuit 51 improves a power factor by matching the waveform of an AC power supply voltage to the waveform of a current flowing through converter CV, i.e., by causing the current to have a waveform close to a sinusoidal waveform.

When there is no PFC circuit 51, the current has a high frequency waveform due to a ripple current in the capacitor. By switching IGBT 31 in PFC circuit 51, a sinusoidal current waveform having a frequency close to that of the voltage waveform can be generated. Thereby, noise caused by the ripple current can be reduced.

Figure 10:
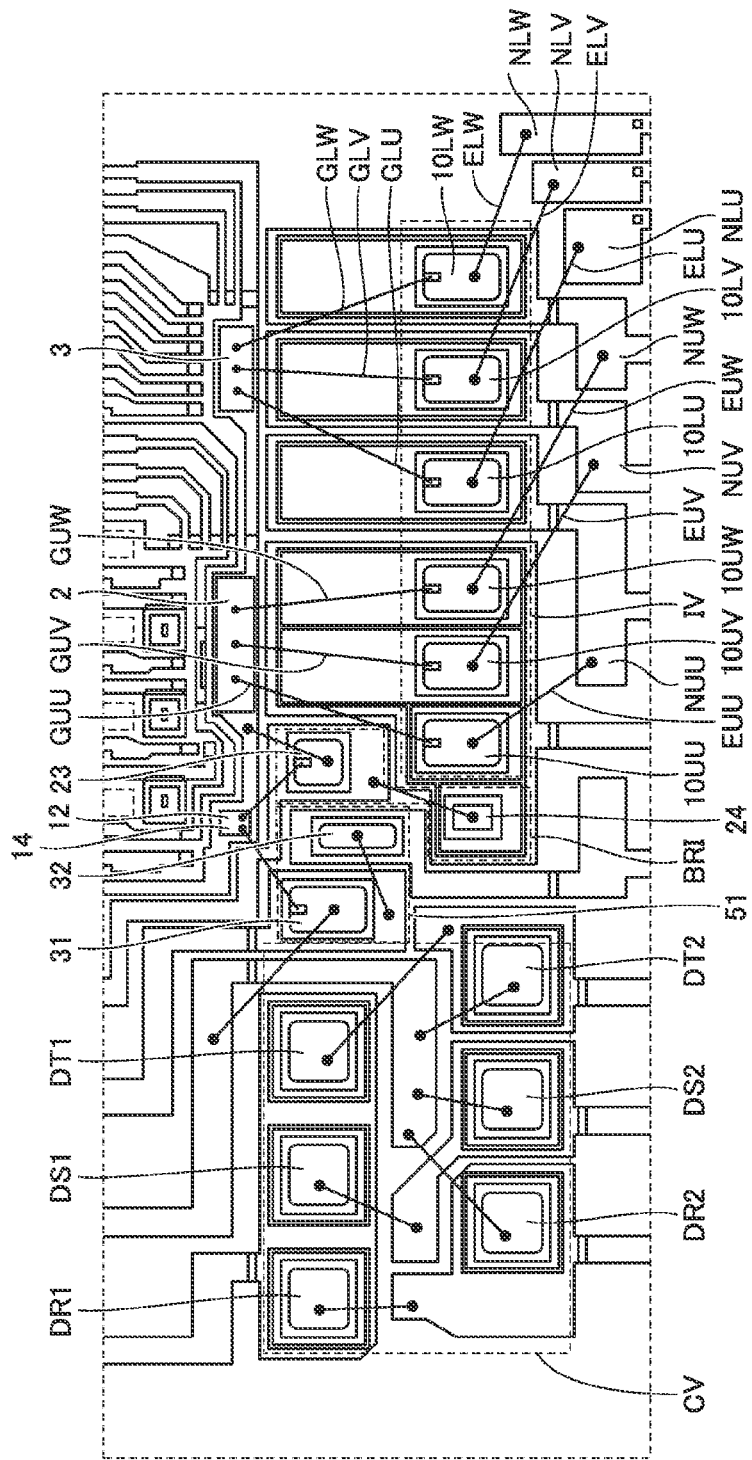
FIG. 10 is a view showing a portion of a layout of the transfer mold-type IPM of the fifth embodiment.

FIG. 10 is a view showing a portion of a layout of the transfer mold-type IPM of the fifth embodiment.

As shown in FIG. 10, three-phase inverter IV, HVIC 2, and LVIC 3 are arranged as in the first embodiment. In the fifth embodiment, converter CV is arranged, and some components (BRI) of brake circuit BR and PFC circuit 51 are arranged between converter CV and three-phase inverter IV. Further, LVIC 12 is arranged adjacent to some components (BRI) of brake circuit BR and HVIC 2.

In the present embodiment, since the arrangement of three-phase inverter IV, HVIC 2, LVIC 3, and power terminals NUU, NUV, NUW, NLU, NLV, NLW is the same as that in the first embodiment, the same effect as that in the first embodiment can be obtained.

Further, in the present embodiment, the PFC circuit can reduce noise, which can facilitate substrate design.

It should be noted that, although the transfer mold-type IPM of the fifth embodiment is configured to include the components of PFC circuit 51 in addition to the components of the fourth embodiment, it is not limited thereto. The transfer mold-type IPM may be configured to include the components of PFC circuit 51 in addition to the components of the second or third embodiment.

Sixth Embodiment

Figure 11:
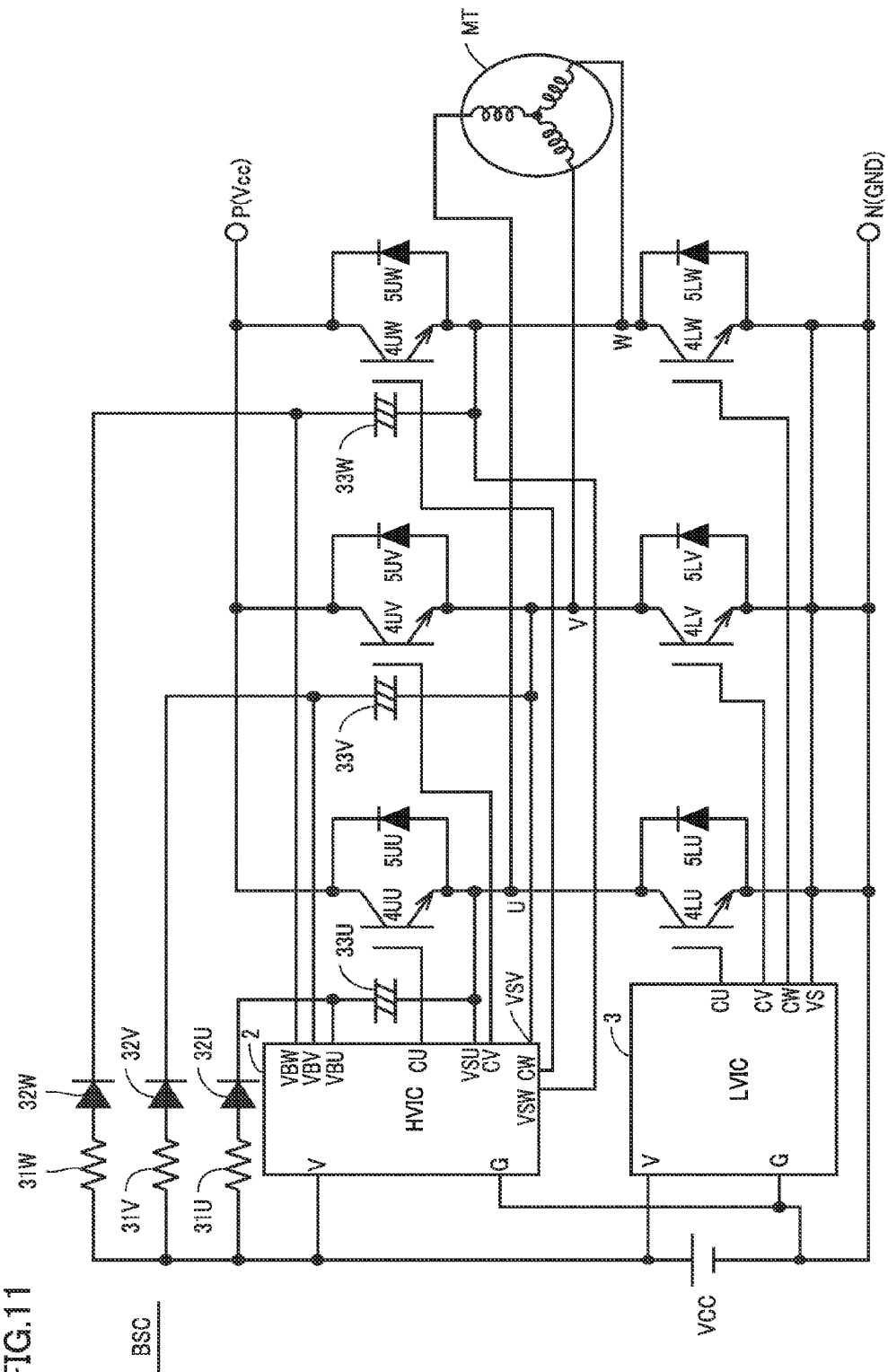
FIG. 11 is a view showing components included in a transfer mold-type IPM in a sixth embodiment.

FIG. 11 is a view showing components included in a transfer mold-type IPM in a sixth embodiment.

In the sixth embodiment, the transfer mold-type IPM includes a bootstrap circuit BSC, in addition to the components of the first embodiment.

Bootstrap circuit BSC includes bootstrap diodes 32U, 32V, 32W, bootstrap capacitors 33U, 33V, 33W, and current limiting resistors 31U, 31V, 31W.

A VBU terminal of HVIC 2 is connected with one terminal of bootstrap capacitor 33U. A VSU terminal of HVIC 2 is connected with the other terminal of bootstrap capacitor 33U, an emitter terminal of IGBT 4UU, and an anode of FWD 5UU. A VBV terminal of HVIC 2 is connected with one terminal of bootstrap capacitor 33V. A VSV terminal of HVIC 2 is connected with the other terminal of bootstrap capacitor 33V, an emitter terminal of IGBT 4UV, and an anode of FWD 5UV. A VBW terminal of HVIC 2 is connected with one terminal of bootstrap capacitor 33W. The other terminal of bootstrap capacitor 33W is connected to a VSW terminal of HVIC 2. The VSW terminal of HVIC 2 is connected with the other terminal of bootstrap capacitor 33W, an emitter terminal of IGBT 4UW, and an anode of FWD 5UW.

A CU terminal of HVIC 2 is connected with a gate terminal of IGBT 4UU. A CV terminal of HVIC 2 is connected with a gate terminal of IGBT 4UV. A CW terminal of HVIC 2 is connected with a gate terminal of IGBT 4UW. A CU terminal of LVIC 3 is connected with a gate terminal of IGBT 4LU. A CV terminal of LVIC 3 is connected with a gate terminal of IGBT 4LV. A CW terminal of LVIC 3 is connected with a gate terminal of IGBT 4LW.

A ground terminal G of HVIC 2 and a ground terminal G of LVIC 3 are connected to the ground. A Vcc terminal V of HVIC 2 and a Vcc terminal V of LVIC 3 are connected to a common power supply VCC.

Current limiting resistor 31U and bootstrap diode 32U are arranged between Vcc terminal V and the VBU terminal of HVIC 2. Current limiting resistor 31V and bootstrap diode 32V are arranged between Vcc terminal V and the VBV terminal of HVIC 2. Current limiting resistor 31W and bootstrap diode 32W are arranged between Vcc terminal V and the VBW terminal of HVIC 2.

Figure 12:
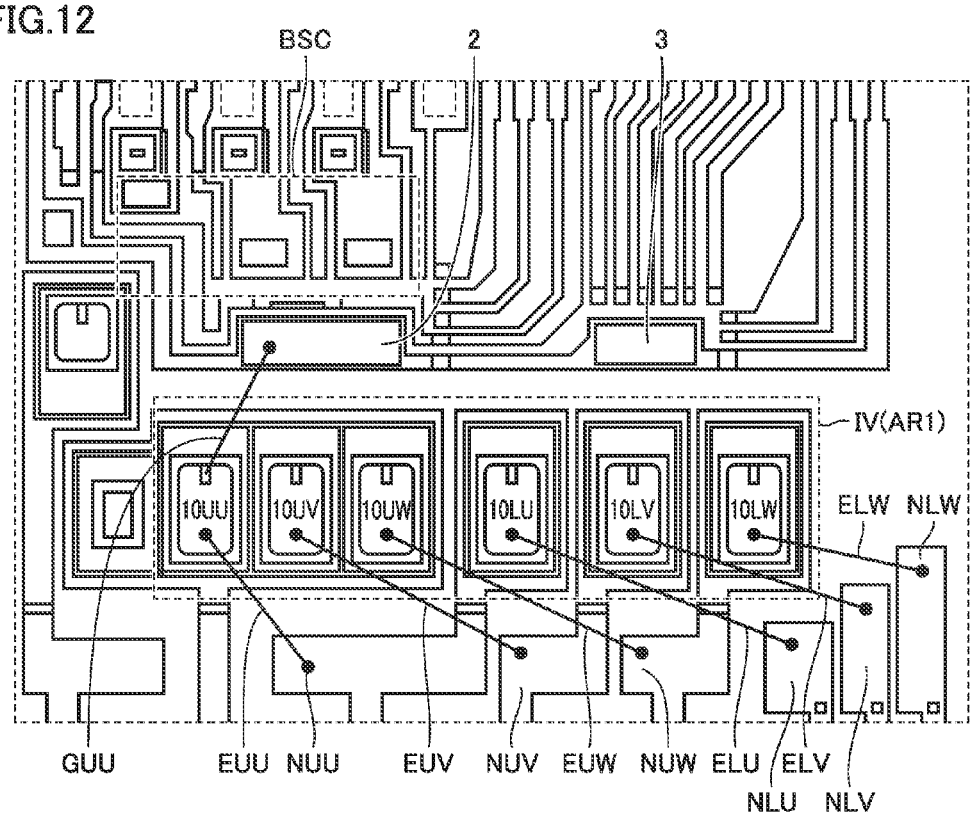
FIG. 12 is a view showing a portion of a layout of the transfer mold-type IPM of the sixth embodiment.

FIG. 12 is a view showing a portion of a layout of the transfer mold-type IPM of the sixth embodiment.

As shown in FIG. 12, three-phase inverter IV, HVIC 2, and LVIC 3 are arranged as in the first embodiment. However, in the present embodiment, a die pad area AR1 where three-phase inverter IV is arranged is smaller than die pad area AR where three-phase inverter IV is arranged in the conventional case and the first to fifth embodiments.

In the present embodiment, by providing narrower die pad area AR1, there is provided a vacant space where other components can be arranged, and thus bootstrap circuit BSC is further arranged.

In the present embodiment, since the arrangement of three-phase inverter IV, HVIC 2. LVIC 2, and power terminals NUU, NUV. NUW, NLU, NLV, NLW is the same as that in the first embodiment, the same effect as that in the first embodiment can be obtained.

Further, in the present embodiment, by a floating power supply using the bootstrap circuit, four independent power supplies required when driving an ordinary three-phase inverter (i.e., three power supplies for driving RC-IGBTs for upper arms of three phases and one power supply for driving an RC-IGBT for a lower arm of one phase) can be operated by drive control power supply VCC. In the present embodiment, the bootstrap capacitor and the like which have been conventionally wired outside can be contained in the vacant space in the transfer mold-type IPM. This facilitates substrate design.

It should be noted that, although the transfer mold-type IPM of the present embodiment is configured to include bootstrap circuit BSC in addition to the components of the first embodiment, it is not limited thereto. The transfer mold-type IPM may be configured to include bootstrap circuit BSC in addition to the components of the second or third embodiment.

In addition, the transfer mold-type IPM of the present embodiment may further be configured to include one or a plurality of converter CV, some components (BRI) of brake circuit BR, and PFC circuit 51.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A semiconductor module, comprising:
at least one RC-IGBT;
at least one control IC;
a power terminal;
a gate wire which connects a gate of an IGBT in the RC-IGBT and the control IC; and an emitter wire which connects an emitter of the IGBT in the RC-IGBT and the power terminal,
the semiconductor module including a die pad area between a position where the power terminal is arranged and a position where the control IC is arranged, the RC-IGBT being arranged in the die pad area at a position closer to the power terminal than to the control IC;

wherein the at least one RC-IGBT is a plurality of RC-IGBTs, and the semiconductor module further comprises one or more power terminals, a plurality of gate wires connecting gates of each of the IGBTs in the RC-IGBTs with the control IC, and a plurality of emitter wires connecting emitters of each of the IGBTs in the RC-IGBTs with the one or more power terminals, and the die pad area is a single die pad area between a position where the one or more power terminals are arranged and a position where the control IC is arranged, with the plurality of RC-IGBTs being arranged on the single die pad area closer to the one or more power terminals than to the control IC.

2. The semiconductor module according to claim 1, wherein the die pad area is a rectangle, and when a side of the die pad area closest to the control IC is defined as a first side and a side opposite to the first side is defined as a second side, the RC-IGBT is arranged at a position closer to the second side than to the first side in a direction perpendicular to the first side and the second side.

3. The semiconductor module according to claim 2, wherein the semiconductor module comprises a plurality of the RC-IGBTs constituting a three-phase inverter, and the plurality of the RC-IGBTs are arranged in one line along the second side.

4. A semiconductor module, comprising:
a plurality of RC-IGBTs constituting a three-phase inverter;
at least one control IC;
a power terminal;
a gate wire which connects a gate of an IGBT in each of the RC-IGBTs and the control IC; and
an emitter wire which connects an emitter of the IGBT in each of the RC-IGBTs and the power terminal,
the semiconductor module including a rectangular die pad area between a position where the power terminal is arranged and a position where the control IC is arranged,
when a side of the die pad area closest to the control IC is defined as a first side and a side opposite to the first side is defined as a second side, one of an RC-IGBT for an upper arm and an RC-IGBT for a lower arm of each phase being arranged at a position closer to the first side than to the second side in a direction perpendicular to the first side, and the other thereof being arranged at a position closer to the second side than to the first side in the direction perpendicular to the first side, in the die pad area.

5. The semiconductor module according to claim 4, wherein the plurality of RC-IGBTs are arranged in a staggered pattern along a direction parallel to the first side.

6. A semiconductor module, comprising:
a plurality of RC-IGBTs constituting a three-phase inverter;
at least one control IC;
a power terminal;
a gate wire which connects a gate of an IGBT in each of the RC-IGBTs and the control IC; and
an emitter wire which connects an emitter of the IGBT in each of the RC-IGBTs and the power terminal,
the semiconductor module including a rectangular die pad area between a position where the power terminal is arranged and a position where the control IC is arranged,
when a side of the die pad area closest to the control IC is defined as a first side and a side opposite to the first side is defined as a second side, one of an RC-IGBT for an upper arm and an RC-IGBT for a lower arm of each of two phases being arranged at a position closer to the first side than to the second side in a direction perpendicular to the first side, the other thereof being arranged at a position closer to the second side than to the first side in the direction perpendicular to the first side, both of an RC-IGBT for an upper arm and an RC-IGBT for a lower arm of one phase being each arranged at a substantially central position between the first side and the second side, in the die pad area.

7. The semiconductor module according to claim 6, wherein the die pad area is divided into a first area and a second area in a direction of the first side, and three RC-IGBTs for the upper arms are arranged in the first area, and three RC-IGBTs for the lower arms are arranged in the second area.

8. The semiconductor module according to claim 7, wherein the three RC-IGBTs for the upper arms are arranged in a step-like pattern in the first area, and the three RC-IGBTs for the lower arms are arranged in a step-like pattern in the second area.

9. The semiconductor module according to claim 1, further comprising:
a converter; and
at least one component of a brake circuit.

10. The semiconductor module according to claim 9, further comprising a PFC circuit which increases a power factor of electric power supplied from the converter.

11. The semiconductor module according to claim 1, wherein the control IC includes a high-side control circuit which controls an RC-IGBT for an upper arm, and a low-side control circuit which controls an RC-IGBT for a lower arm, and the semiconductor module further comprises a bootstrap circuit which supplies electric power to the high-side control circuit.

12. The semiconductor module according to claim 1, wherein a length of the emitter wire is shorter than a length of the gate wire.

* * * * *